(12) United States Patent
Kubota et al.

(10) Patent No.: US 12,165,009 B2
(45) Date of Patent: Dec. 10, 2024

(54) QUANTUM BIT CELL AND QUANTUM BIT INTEGRATED CIRCUIT

(71) Applicant: NATIONAL INSTITUTE OF ADVANCED INDUSTRIAL SCIENCE AND TECHNOLOGY, Tokyo (JP)

(72) Inventors: Hitoshi Kubota, Ibaraki (JP); Shingo Tamaru, Ibaraki (JP); Akio Fukushima, Ibaraki (JP); Takahiro Mori, Ibaraki (JP); Takashi Matsukawa, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 537 days.

(21) Appl. No.: 17/603,517

(22) PCT Filed: Apr. 14, 2020

(86) PCT No.: PCT/JP2020/016392
§ 371 (c)(1),
(2) Date: Oct. 13, 2021

(87) PCT Pub. No.: WO2020/213596
PCT Pub. Date: Oct. 22, 2020

(65) Prior Publication Data
US 2022/0222564 A1    Jul. 14, 2022

(30) Foreign Application Priority Data
Apr. 15, 2019    (JP) ................ 2019-076914

(51) Int. Cl.
*G06N 10/40* (2022.01)
*H10N 50/10* (2023.01)
*H10N 50/80* (2023.01)

(52) U.S. Cl.
CPC ........... *G06N 10/40* (2022.01); *H10N 50/10* (2023.02); *H10N 50/80* (2023.02)

(58) Field of Classification Search
CPC ....... G06N 10/00; G06N 10/20; G06N 10/40; G06N 10/60; H10N 50/10; H10N 50/80; H01L 29/06; H01L 29/82
(Continued)

(56) References Cited

U.S. PATENT DOCUMENTS

| 2015/0372687 A1* | 12/2015 | Buhrman | H03B 15/006 |
| | | | 331/94.1 |
| 2018/0301266 A1* | 10/2018 | Ou | H10N 50/10 |

FOREIGN PATENT DOCUMENTS

| JP | 2007-049009 A | 2/2007 |
| JP | 2014-216596 A | 11/2014 |
| JP | 2017-117884 A | 6/2017 |

OTHER PUBLICATIONS

International Search Report issued in Application No. PCT/JP2020/016392, mailed Jun. 30, 2020.
(Continued)

*Primary Examiner* — Paul Dinh
(74) *Attorney, Agent, or Firm* — Michael Best & Friedrich LLP

(57) ABSTRACT

The present invention addresses the problem of providing a quantum bit cell and a quantum bit integrated circuit having an easy-to-integrate structure. The quantum bit cell of the present invention including a spin torque oscillator capable of emitting a microwave with a propagation distance of 1 μm or less and having a maximum diameter of 1 μm or less, and a solid-state element quantum bit arranged near the spin
(Continued)

torque oscillator at an interval of the propagation distance or less, where a quantum two-level system is controlled by the microwave.

6 Claims, 11 Drawing Sheets

(58) Field of Classification Search
USPC .......................................................... 716/100
See application file for complete search history.

(56) References Cited

OTHER PUBLICATIONS

Bishnu Patra et al., "Cryo-CMOS Circuits and Systems for Quantum Computing Applications", IEEE Journal of Solid-State Circuits, Jan. 2018, vol. 53, pp. 309-321, IEEE.
M. Pioro-Ladriere et al., "Electrically driven single-electron spin resonance in a slanting Zeeman field", nature physics, Oct. 2008, Published online Aug. 17, 2008, vol. 4, pp. 776-779, DOI: 10.1038/nphys 1053, Macmillan Publishers Limited.
S.I. Kiselev et al., "Microwave oscillations of a nanomagnet driven by a spin-polarized current", letters to nature, Sep. 2003, vol. 425, pp. 380-383, Nature Publishing Group.
D. Houssameddine et al., "Spin-torque oscillator using a perpendicular polarizer and a planar free layer", nature materials, Jun. 2007, Published online Apr. 29, 2007, vol. 6, pp. 447-453, DOI: 10.1038/nmat1095, Nature Publishing Group.
Hitoshi Kubota et al., "Spin-torque Oscillator Based on Magnetic Tunnel Junction with a Perpendicularly Magnetized Free Layer and In-Plane Magnetized Polarizer", Applied Physics Express, Published online Sep. 27, 2013, vol. 6, pp. 103003-1-103003-3, DOI: 10.7567/APEX.6.103003, The Japan Society of Applied Physics.
V.S. Pribiag et al., "Magnetic vortex oscillator driven by d.c. spin-polarized current", nature physics, Jul. 2007, Published online May 7, 2007, vol. 3, pp. 498-503, DOI: 10.1038/nphys619, Nature Publishing Group.

Shingo Tamaru et al., "Bias field angle dependence of the self-oscillation of spin torque oscillators having a perpendicularly magnetized free layer and in-plane magnetized reference layer", Applied Physics Express, Published online May 22, 2014, vol. 7, pp. 063005-1-063005-4, DOI: 10.7567/APEX.7.063005, The Japan Society of Applied Physics.
Bochong Wang et al., "Diameter dependence of emission power in MgO-based nano-pillar spin-torque oscillators", Applied Physics Letters, Published online Jun. 22, 2016, vol. 108, pp. 253502-1-253502-4, DOI: 10.1063/1.4954760, AIP Publishing.
Kyoung-Min Lee et al., "Temperature dependence of the interfacial magnetic anisotropy in W/CoFeB/MgO", AIP Advances, Published online Jun. 6, 2017, vol. 7, pp. 065107-1-065107-7, AIP Publishing.
Shinji Yuasa, "Giant Tunneling Magnetoresistance in MgO-Based Magnetic Tunnel Junctions", Journal of the Physical Society of Japan, Mar. 2008, vol. 77, No. 3, pp. 031001-1-031001-13, DOI: 10.1143/JPSJ.77.031001, The Physical Society of Japan.
S.G. Wang et al., "Temperature dependence of giant tunnel magnetoresistance in epitaxial Fe/MgO/Fe magnetic tunnel junctions", Physical Review B, Nov. 17, 2008, vol. 78, pp. 180411-1-180411-4, DOI: 10.1103/PhysRevB.78.180411, The American Physical Society.
M.L. Schneider et al., "Temperature dependence of spin-torque-driven self-oscillations", Physical Review B, Oct. 15, 2009, vol. 80, pp. 144412-1-144412-6, DOI: 10.1103/PhysRevB.80.144412, The American Physical Society.
J.F. Sierra et al., "Influence of Thermal fluctuations on the emission linewidth in MgO-based spin transfer oscillators", Applied Physics Letters, Published online Aug. 6, 2012, vol. 101, pp. 062407-1-062407-4, DOI: 10.1063/1.4744924, American Institute of Physics.
P. Bortolotti et al., "Temperature dependence of microwave voltage emission associated to spin-transfer induced vortex oscillation in magnetic tunnel junction", Applied Physics Letters, Published online Jan. 27, 2012, vol. 100, pp. 042408-1-062407-3, DOI: 10.1063/1.3680091, American Institute of Physics.
R.H. Liu et al., "Spectral Characteristics of the Microwave Emission by the Spin Hall Nano-Oscillator", Physical Review Letters, Apr. 1, 2013, vol. 110, pp. 147601-1-147601-5, DOI: 10.1103/PhysRevLett. 110.147601, American Physical Society.

* cited by examiner

QUANTUM BIT CELL AND QUANTUM BIT INTEGRATED CIRCUIT

TECHNICAL FIELD

The present invention relates to a quantum bit cell in which a solid-state element quantum bit and a spin torque oscillator are arranged, and a quantum bit integrated circuit in which multiple quantum bit cells are arranged.

BACKGROUND ART

Research on a solid-state element quantum bit with a quantum two-level system controlled by a microwave is underway.

The solid-state element quantum bit generally requires a cryogenic operating environment of 100 mK or less, and is arranged inside a temperature control device for cryogenic use such as a cryostat.

A microwave generator placed outside of the temperature control device as a supply source introduces the microwave from outside of the temperature control device into the temperature control device to supply the microwave to the solid-state element quantum bit as a target in order to control the state of the quantum bit.

For example, after the microwave is introduced into the temperature control device from outside of the temperature control device through a coaxial cable connected to the microwave generator, the microwave in an appropriately distributed state is transmitted to each individual solid-state element quantum bit through a multiplexer and a high-frequency transmission line arranged inside the temperature control device (see Non-Patent Document 1).

However, since the high-frequency transmission line is large in size unlike power supply wiring and the shape for transmitting the microwave is constrained, it tends to increase the area and is difficult to manufacture, which become factors that hinder the construction of a multi-bit integrated circuit in which many solid-state element quantum bits mentioned above are arranged.

Further, the high-frequency transmission line easily generates a so-called crosstalk to affect any other solid-state element quantum bit different from the target solid-state element quantum bit, which becomes a factor that hinders selective operation to each individual solid-state element quantum bit.

As for the crosstalk problem, there is such a proposal that a micromagnet is placed in a transmission destination of the high-frequency transmission line to selectively supply the microwave to the target solid-state element quantum bit by a gradient magnetic field generated by the micromagnet under the irradiation of the microwave (see Non-Patent Document 2).

However, since the micromagnet has a size of a few tens of μm order, much bigger than the size of the solid-state element quantum bit, which becomes rather a hindrance to integration of solid-state element quantum bits.

PRIOR ART DOCUMENTS

Non-Patent Documents

Non-Patent Document 1: Bishnu Patra et al., IEEE J. Solid-State Circuits 53, 309(2018).
Non-Patent Document 2: M. PIORO-LADRIERE et al., Nature Physics 4, 776 (2008).

SUMMARY OF THE INVENTION

Problems to be solved by the Invention

The present invention is to solve the conventional various problems to achieve the object below. Namely, the present invention is to provide a quantum bit cell and a quantum bit integrated circuit having an easy-to-integrate structure.

Means for solving the Problems

Means for solving the problems are as follows, namely:

<1> A quantum bit cell including a spin torque oscillator capable of emitting a microwave with a propagation distance of 1 μm or less and having a maximum diameter of 1 μm or less, and a solid-state element quantum bit arranged near the spin torque oscillator at an interval of the propagation distance or less, where a quantum two-level system is controlled by the microwave.

<2> The quantum bit cell according to the said <1>, wherein the spin torque oscillator is constructed by a spin orbit torque-excited element having a two-layer laminated structure of a nonmagnetic metal layer and an oscillation layer.

<3> The quantum bit cell according to the said <1>, wherein the spin torque oscillator is constructed by a spin valve-type element having a three-layer laminated structure composed of a laminated body of a reference layer and a nonmagnetic layer, and an oscillation layer laminated on the laminated body in such a manner that magnetization in the oscillation layer when not being excited points in one direction.

<4> The quantum bit cell according to the said <1>, wherein the spin torque oscillator is constructed by a magnetic vortex element having a three-layer laminated structure composed of a laminated body of a reference layer and a nonmagnetic layer, and an oscillation layer laminated on the laminated body in such a manner that magnetization in the oscillation layer when not being excited exhibits a vortex distribution.

<5> The quantum bit cell according any one of the said <1> to <4>, wherein the solid-state element quantum bit is constructed by a semiconductor quantum bit element.

<6> The quantum bit cell according to the said <5>, wherein the semiconductor quantum bit element has a transistor structure in which a gate electrode is arranged through an insulating oxide film on a semiconductor-containing layer with a channel region formed of a semiconductor material between a source section and a drain section.

<7> A quantum bit integrated circuit that multiple quantum bit cells according to any one of the said <1> to <6> are arranged.

<8> The quantum bit integrated circuit according to the said <7>, wherein between two adjacent quantum bit cells, a spin torque oscillator in one of the quantum bit cells and a solid-state element quantum bit in the other of the quantum bit cells are placed apart from each other by a distance to exceed the propagation distance of the microwave emitted from the spin torque oscillator.

Advantageous Effect of the Invention

According to the present invention, the various problems in the conventional technology can be solved, and there can be provided a quantum bit cell and a quantum bit integrated circuit having an easy-to-integrate structure.

MODE FOR CARRYING OUT THE INVENTION (Quantum Bit Cell)

A quantum bit cell of the present invention has a spin torque oscillator and a solid-state element quantum bit.

<Spin Torque Oscillator>

The spin torque oscillator is capable of emitting a microwave with a propagation distance of 1 µm or less and having a maximum diameter of 1 µm or less.

The spin torque oscillator is not particularly limited as long as it has such characteristics. For example, a known spin valve-type element, magnetic vortex element, or spin orbit torque-excited element can be regarded as the spin torque oscillator.

—Spin Valve-type Element—

The spin valve-type element has a three-layer laminated structure composed of a laminated body of a reference layer and a nonmagnetic layer, and an oscillation layer laminated on the laminated body in such a manner that the magnetization in the oscillation layer when not being excited points in one direction. Note that the reference layer, the nonmagnetic layer, and the oscillation layer are categorized by the function performed by each layer, and such a case that each of the reference layer, the nonmagnetic layer, and the oscillation layer is formed as a laminated body including a middle layer or the like necessary to perform the function is included.

Figure 1:
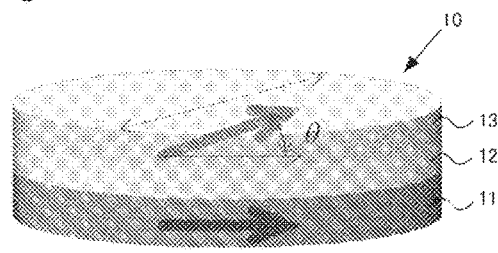
FIG. 1 is an illustration for describing an overview of a spin valve-type element.

A typical structure of the spin valve-type element is illustrated in FIG. 1. Note that FIG. 1 is an illustration for describing an overview of the spin valve-type element.

As illustrated in FIG. 1, a spin valve-type element 10 has a three-layer laminated structure in which a nonmagnetic layer 12 and an oscillation layer 13 are laminated in this order on a reference layer 11. Note that the spin valve-type element 10 can be injected with a direct current by an upper electrode and a lower electrode, not illustrated. Further, the reference layer 11 and the nonmagnetic layer 12 may be arranged by reversing the laminated order unlike that in the illustration.

The reference layer 11 and the oscillation layer 13 are magnetic layers formed of magnetic materials, respectively, and the electrical resistance of the spin valve-type element 10 varies with a relative angle (see "θ" in FIG. 1) between magnetizations of these two magnetic layers. This phenomenon is called magneto-resistance (MR) effect. In general, the electrical resistance is minimized when the two magnetizations of the reference layer 11 and the oscillation layer 13 are parallel (the relative angle is 0 degrees), and the electrical resistance is maximized when the magnetizations are antiparallel (the relative angle is 180 degrees).

When the nonmagnetic layer 12 is formed of metal, a film of the three-layer laminated structure is categorized as a giant magneto-resistance (GMR) film, while when the nonmagnetic layer 12 is formed of an insulator, the film is categorized as a magnetic tunnel junction (MTJ) film.

When being constructed as the giant magneto-resistance film, the reference layer 11 and the oscillation layer 13 are formed, for example, of iron (Fe), nickel (Ni), cobalt (Co), alloy of these, Heusler alloy, or the like, and the nonmagnetic layer 12 is formed, for example, of copper (Cu), silver (Ag), or the like.

Further, when being constructed as the magnetic tunnel junction film, the reference layer 11 and the oscillation layer 13 are formed, for example, of CoFeB alloy composed of CoFe and boron (B) added thereto, or the like, and the nonmagnetic layer 12 is formed, for example, of magnesium oxide (MgO) or the like.

The reference layer 11 is so formed that the thickness thereof is thicker than that of the oscillation layer 13, and the magnetization in the reference layer 11 does not move at the time of excitation by the pinning effect, large magnetic anisotropy, and the like, obtained by using an antiferromagnet as the forming material.

On the other hand, the oscillation layer 13 is so formed that the thickness thereof is thinner than that of the reference layer 11 and the magnetization in the oscillation layer 13 moves at the time of excitation.

When an electron flow is injected into the reference layer 11, electrons having a spin parallel to the magnetization of the reference layer 11 increases more than electrons having a spin antiparallel to the magnetization of the reference layer 11.

Thus, when the spin-polarized electron flow passes through the nonmagnetic layer 12 and is injected into the oscillation layer 13, a torque (Spin Transfer Torque, STT) is exerted in the process of migrating the electron spin to the magnetization of the oscillation layer 13 to excite the precession of the magnetization in the oscillation layer 13.

Thus, the relative angle between two magnetizations in the reference layer 11 and the oscillation layer 13, and hence the electrical resistance of the spin valve-type element 10 vary with the precession frequency of the magnetization. Further, when the direct current is injected into the spin valve-type element 10, a high-frequency voltage given by the product of the electrical resistance varying with the precession of the magnetization and the injected direct current is generated.

Therefore, a high-frequency magnetic field is generated around the spin valve-type element 10 based on the precession of the magnetization of the oscillation layer 13.

In the quantum bit cell, a microwave generated locally around the spin valve-type element 10 based on such a high-frequency magnetic field is used for the operation of the solid-state element quantum bit.

The spin valve-type element 10 is to illustrate a typical structure, which can be categorized into the first type to the third type by the characteristics of the magnetization.

First, a spin valve-type element according to the first type will be described with reference to FIG. 2. Note that FIG. 2 is an illustration for describing an overview of the spin valve-type element according to the first type.

Figure 2:
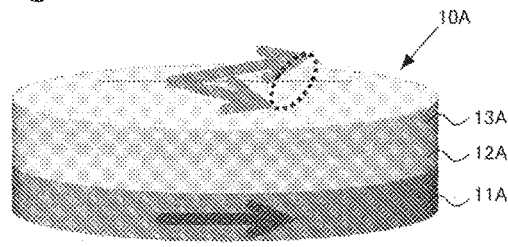
FIG. 2 is an illustration for describing an overview of a spin valve-type element according to a first type.

As illustrated in FIG. 2, a spin valve-type element 10A according to the first type has a three-layer laminated structure in which a nonmagnetic layer 12A and an oscillation layer 13A are laminated in this order on a reference layer 11A. Note that the spin valve-type element 10A according to the first type can be injected with a direct current by an upper electrode and a lower electrode, not illustrated. Further, the reference layer 11A and the nonmagnetic layer 12A may be arranged by reversing the laminated order unlike that in the illustration.

In the spin valve-type element 10A according to the first type, the thickness of the oscillation layer 13A is about 1 nm to 3 nm.

Further, the spin valve-type element 10A according to the first type is so constructed that the magnetizations of the reference layer 11A and the oscillation layer 13A point in intra-layer directions, respectively, when not being excited.

Further, the three-layer laminated structure is generally processed to have an elliptic cylinder shape in order to use magnetic anisotropy by the shape.

The magnetization of the oscillation layer 13A points in a specific intra-layer direction (initial direction) that meets equilibrium conditions determined by the external magnetic field, the internal anisotropic magnetic field, and the like when not being excited, and when the direct current is injected into the reference layer 11A, the magnetization of the oscillation layer 13A moves to process around the initial direction in the equilibrium conditions.

The precession frequency becomes a ferromagnetic resonance frequency determined by the total effective magnetic field received by the magnetization of the oscillation layer 13A and the saturation magnetization of the oscillation layer 13A, which belongs to a microwave region of several GHz to several tens of GHz.

Thus, in the spin valve-type element 10A according to the first type, a microwave magnetic field can be generated therearound by injecting the direct current to excite the precession.

Note that the spin valve-type element 10A according to the first type can be formed with reference to Reference 1 below.

Reference 1: S. I. Kiselev et al., Nature 425, 380 (2003).

Next, a spin valve-type element according to the second type will be described with reference to FIG. 3. Note that FIG. 3 is an illustration for describing an overview of the spin valve-type element according to the second type.

Figure 3:
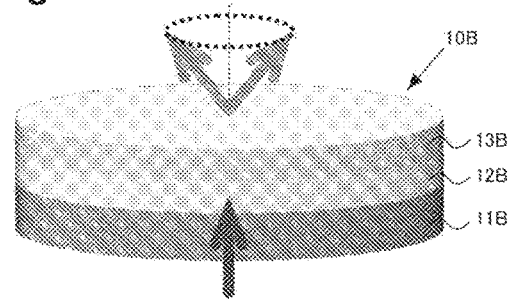
FIG. 3 is an illustration for describing an overview of a spin valve-type element according to a second type.

As illustrated in FIG. 3, a spin valve-type element 10B according to the second type has a three-layer laminated structure in which a nonmagnetic layer 12B and an oscillation layer 13B are laminated in this order on a reference layer 11B. Note that the spin valve-type element 10B according to the second type can be injected with a direct current by an upper electrode and a lower electrode, not illustrated. Further, the reference layer 11B and the nonmagnetic layer 12B may be arranged by reversing the laminated order unlike that in the illustration.

In the spin valve-type element 10B according to the second type, the thickness of the oscillation layer 13B is about 1 nm to 3 nm, and the thickness of the reference layer 11B is made thicker than that of the oscillation layer 13B.

In the spin valve-type element 10B according to the second type, the magnetization of the reference layer 11B points in the lamination direction and the magnetization of the oscillation layer 13B points in an intra-layer direction when being not excited.

Further, the three-layer laminated structure is generally processed to have an elliptic cylinder shape in order to suppress magnetic anisotropy by the shape.

In the spin valve-type element 10B according to the second type, when the direct current is injected into the reference layer 11B, a torque (STT) is so exerted that the magnetization of the oscillation layer 13B rises up from the intra-layer direction towards the vertical axis orthogonal to the intra-layer direction by an electron flow spin-polarized by the perpendicular magnetization of the reference layer 11B. Thus, the magnetization of the oscillation layer 13B receives a torque exerted by a diamagnetic field to move so as to precess around the vertical axis.

The precession frequency becomes a ferromagnetic resonance frequency by the total effective magnetic field received by the magnetization of the oscillation layer 13B. However, since the effective magnetic field received by the oscillation layer 13B contains a diamagnetic field by itself, and the magnitude of the diamagnetic field varies with the rising angle from the intra-layer direction of the magnetization of the oscillation layer 13B. In other words, the larger the rising angle, the larger the diamagnetic field.

Since this rising angle varies with the magnitude of the direct current injected into the reference layer 11B, the excitation intensity of the precession can be controlled by controlling the direct current even in the spin valve-type element 10B according to the second type to generate a microwave magnetic field therearound.

Note that the spin valve-type element 10B according to the second type can be formed with reference to Reference 2 below.

Reference 2: D. Houssameddine et al., Nat. Mater. 6,447 (2007).

Next, a spin valve-type element according to the third type will be described with reference to FIG. 4. Note that FIG. 4 is an illustration for describing an overview of the spin valve-type element according to the third type.

Figure 4:
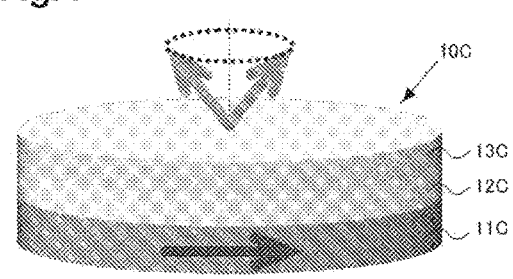
FIG. 4 is an illustration for describing an overview of a spin valve-type element according to a third type.

As illustrated in FIG. 4, a spin valve-type element 10C according to the third type has a three-layer laminated structure in which a nonmagnetic layer 12C and an oscillation layer 13C are laminated in this order on a reference layer 11C. Note that the spin valve-type element 10C according to the third type can be injected with a direct current by an upper electrode and a lower electrode, not illustrated. Further, the reference layer 11C and the nonmagnetic layer 12C may be arranged by reversing the laminated order unlike that in the illustration.

In the spin valve-type element 10C according to the third type, the thickness of the oscillation layer 13C is about 1 nm to 3 nm, and the thickness of the reference layer 11C is made thicker than that of the oscillation layer 13C.

In the spin valve-type element 10C according to the third type, the magnetizations of the reference layer 11C and the oscillation layer 13C point in intra-layer directions, respectively, when not being excited.

Further, the three-layer laminated structure is generally processed to have an elliptic cylinder shape in order to suppress magnetic anisotropy by the shape.

In the spin valve-type element 10C according to the third type, when the direct current is injected into the reference layer 11C on condition that a magnetic field in a direction perpendicular to the surface of the oscillation layer 13C (in the laminated direction of the oscillation layer 13C) is applied, a torque (STT) is so exerted on the oscillation layer 13C that the magnetization moves to precess around the vertical axis orthogonal to the intra-layer direction like in the spin valve-type element 10B according to the second type. At this time, the torque (STT) gives precession energy in one half of the orbit, and the torque (STT) takes away precession energy in the other half of the orbit. However, since the magnitude of the torque (STT) is asymmetric between a case where the magnetization of the oscillation layer 13C is tilted to the side parallel to the magnetization of the reference layer 11C and a case where the magnetization of the oscillation layer 13C is tilted to the side antiparallel to the magnetization of the reference layer 11C, the total energy balance is not zero in total of one precession circle, that is, it is always positive and hence the precession is regularly excited. Thus, even in the spin valve-type element 10C according to the third type, the precession of the magnetization of the oscillation layer 13C can be excited by injecting the direct current to generate a microwave magnetic field therearound.

Note that the spin valve-type element 10C according to the third type can be formed with reference to Reference 3 below.

Reference 3: H. Kubota et al., Appl. Phys. Express 6, 103003 (2013).

—Magnetic Vortex Element—

The magnetic vortex element has a three-layer laminated structure composed of a laminated body of a reference layer and a nonmagnetic layer, and an oscillation layer laminated on the laminated body in such a manner that the magnetization in the oscillation layer when not being excited exhibits a vortex distribution. Note that the reference layer, the nonmagnetic layer, and the oscillation layer are categorized by the function performed by each layer, and such a case that each of the reference layer, the nonmagnetic layer, and the oscillation layer is formed as a laminated body including a middle layer or the like necessary to perform the function is included.

The magnetic vortex element has most of the structure and characteristics common to those of the spin valve-type element. In the following, the structure and characteristics different from those of the spin valve-type element will be mainly described.

The structure and characteristics of the magnetic vortex element will be described with reference to FIG. 5. Note that FIG. 5 is an illustration for describing an overview of a magnetic vortex element.

Figure 5:
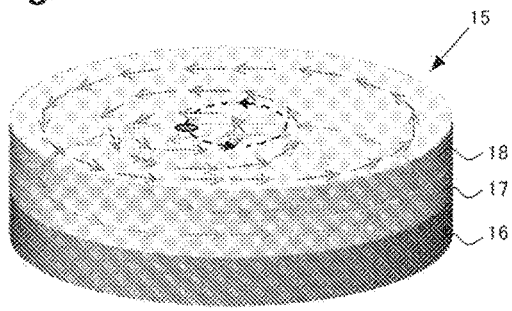
FIG. 5 is an illustration for describing an overview of a magnetic vortex element.

As illustrated in FIG. 5, a magnetic vortex element 15 has a three-layer laminated structure in which a nonmagnetic layer 17 and an oscillation layer 18 are laminated in this order on a reference layer 16. Note that the magnetic vortex element 15 can be injected with a direct current by an upper electrode and a lower electrode, not illustrated. Further, the reference layer 16 and the nonmagnetic layer 17 may be arranged by reversing the laminated order unlike that in the illustration.

In the magnetic vortex element 15, the thickness of the oscillation layer 18 is about 3 nm to 10 nm, which is set thicker than the oscillation layers 13A to 13C.

Further, the three-layer laminated structure is generally formed into an elliptic cylinder shape as mentioned above.

In the magnetic vortex element 15, the direction of the magnetization in the oscillation layer 18 when not being excited differs greatly from those of the spin valve-type elements 10A to 10C, that is, the magnetization of the oscillation layer 18 exhibits a vortex distribution when not being excited to form a magnetic vortex. The center of this magnetic vortex (magnetic vortex core) is located at the center point of the oscillation layer 18 when not being excited. When the oscillation layer 18 is magnetized uniformly, the magnetic vortex appears in such a state that a demagnetizing field generated at the edge is stronger than an exchange interaction magnetic field caused by the bending of the magnetization along the edge.

The magnetization of the reference layer 16 when not being excited includes both of magnetization exhibiting a vortex distribution (see FIG. 5) like that in the oscillation layer 18, and magnetization in an in-plane direction.

In the magnetic vortex element 15, when the direct current is injected into the reference layer 16, a torque (STT) is exerted on the oscillation layer 18 by an electron flow spin-polarized by the magnetization of the reference layer 16 to make the magnetic vortex core rotate around the center point as the center of the oscillation layer 18. This rotation causes average magnetization in the oscillation layer 18 to change by a rotation frequency to generate a microwave magnetic field with this rotation frequency.

Unlike in the spin valve-type elements 10A to 10C, an oscillation frequency is determined by the rotation frequency of the magnetic vortex core in the magnetic vortex element 15. This rotation frequency is about one digit lower than the frequency of the microwave magnetic field based on the precession in the spin valve-type elements 10A to 10C, which is about several hundreds of MHz to 2 GHz.

On the other hand, since the magnetic vortex is structurally stable, and the oscillation layer 18 is formed to have thickness and diameter larger than the oscillation layers 13A to 13C, the magnetic vortex element 15 has the advantage of excellent stability against heat. Further, the magnetic vortex element 15 in which the generation of the microwave magnetic field is based on the rotation of the magnetic vortex core has the advantage that an oscillation peak shaper than those in the spin valve-type elements 10A to 10C based on the precession of the magnetization can be obtained.

Note that the magnetic vortex element 15 can be formed with reference to Reference 4 below.

Reference 4: V. S. Pribiag et al., Nat. Phys. 3, 498 (2007).

—Spin Orbit Torque-Excited Element—

The spin orbit torque-excited element has a two-layer laminated structure of a nonmagnetic metal layer and an oscillation layer.

The spin orbit torque-excited element is not particularly limited, and a known element structure can be adopted.

Figure 6:
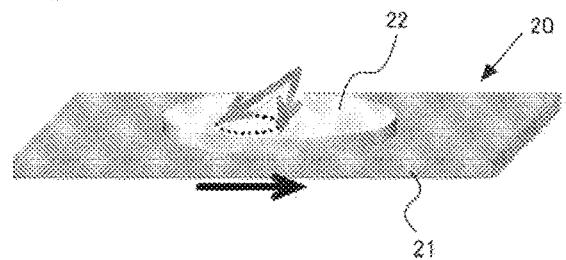
FIG. 6 is an illustration for describing an overview of a spin orbit torque-excited element.

The element structure of the spin orbit torque-excited element is illustrated in FIG. 6. Note that FIG. 6 is an illustration for describing an overview of the spin orbit torque-excited element. As illustrated in FIG. 6, a spin orbit torque-excited element 20 has a two-layer laminated structure in which an oscillation layer 22 is laminated on a nonmagnetic metal layer 21. Note that unillustrated end section electrodes are connected on both end sides of the nonmagnetic metal layer 21 so that a direct current can be injected into the nonmagnetic metal layer 21.

The nonmagnetic metal layer 21 is formed of metal large in atomic number, such as platinum (Pt) or tantalum (Ta), and hence exhibiting a large spin orbit interaction (SOI).

The thickness of the nonmagnetic metal layer 21 is about 1 nm to 2 nm.

Further, the oscillation layer 22 is formed in the same way as the oscillation layer in the spin valve-type element.

When the direct current is injected into the nonmagnetic metal layer 21, electrons having the same polarity among electrons of two types having spins in directions perpendicular to the direction of an electron flow within the layer (up-spin and down-spin) are separated into the upper side and the lower side of the nonmagnetic metal layer 21, and unevenly distributed by spin orbit interaction (SOI).

Then, spin-polarized electrons are injected into the oscillation layer 22 laminated on the nonmagnetic metal layer 21 to excite the precession of the magnetization within the layer of the oscillation layer 22 so as to generate a microwave magnetic field therearound.

The precession frequency becomes a ferromagnetic resonance frequency determined by the total effective magnetic field received by the magnetization of the oscillation layer 22 and the saturation magnetization of the oscillation layer 22, which belongs to a microwave region of several GHz to several tens of GHz.

Even when the spin torque oscillator has any of the element structures, that is, the spin valve-type element, the magnetic vortex element, or the spin orbit torque-excited element, the size of each of constituting layers in the lamination direction and the size of each of constituting layers in the intra-layer direction are 500 nm to 1 μm at most, respectively, and this contributes ease of integration accompanied by downsizing of the quantum bit cell. Note that each of the sizes is about 10 nm at minimum.

Further, the microwave emitted from the spin torque oscillator is derived from the microwave magnetic field generated based on the precession of the magnetization in the oscillation layer and the rotation of the magnetic vortex core, and the propagation distance is 10 nm to 1 μm. Therefore, arranging the solid-state element quantum bit near the spin torque oscillator at an interval of this propagation distance or less contributes to ease of integration accompanied by downsizing of the quantum bit cell.

Further, though will be described together with embodiments later, the formation process of the spin torque oscillator has an affinity with a conventional semiconductor manufacturing process, and this also contributes to ease of integration of the quantum bit cell from the viewpoint of ease of manufacture.

<Solid-State Element Quantum Bit>

The solid-state element quantum bit is arranged near the spin torque oscillator at the interval of the propagation distance or less, and a quantum two-level system is controlled by the microwave.

The quantum two-level system is composed of two independent quantum states, and each of the quantum states is represented as a quantum bit in which two of |0> state and |1> state hold one quantum information.

Figure 7:
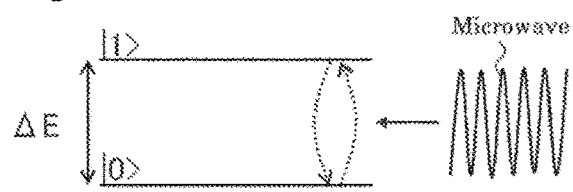
FIG. 7 is an illustration for describing the operating status of a solid-state element quantum bit.

As illustrated in FIG. 7, when an energy difference between the two quantum states is denoted by ΔE, the solid-state element quantum bit resonates (Rabi resonance) with a microwave upon receiving the irradiation of the microwave having energy corresponding to ΔE to cause |0> state and |1> state to overlap so as to produce oscillations called Rabi oscillations where |0> state and |1> state are repeated while taking an intermediate state according to the irradiation time of the microwave.

Therefore, in the solid-state element quantum bit, the irradiation time of the microwave can be controlled to control a superposition state of |0> state and |1> state of the quantum bit and the intermediate state therebetween.

As ΔE, 500 μeV or less is set, and most of ΔE is about 0.5 μeV to 100 μeV. The frequency of an electromagnetic wave having energy corresponding to this ΔE is 100 MHz to 24 GHz. In this specification, the "microwave" means an electromagnetic wave belonging to a wavelength band of 100 MHz to 24 GHz.

Note that FIG. 7 is an illustration for describing the operating status of the solid-state element quantum bit.

The solid-state element quantum bit is not particularly limited, and various quantum bit elements categorized, for example, as a superconducting quantum bit element, a semiconductor quantum bit element, and a color center quantum bit element can be cited.

The superconducting quantum bit element is a quantum bit element constructed by using a superconductor material, and for example, a flux quantum bit element, a charge quantum bit element such as of a transmon type, and a phase quantum bit element can be cited.

The semiconductor quantum bit element is a quantum bit element constructed by using a semiconductor material, and for example, a gate defined type quantum bit element, a MOSFET (Field Effect Transistor) type quantum bit element, a doner type quantum bit element, and a TFET (Tunnel Field-Effect Transistor) type quantum bit element can be cited. Note that these quantum bit elements are categorized into charge quantum bit elements and spin quantum bit elements when focusing on an information carrier of the quantum information to be controlled, and the spin quantum bit elements may further be categorized into and called an electron spin quantum bit element and a nuclear spin quantum bit element, respectively.

The color center quantum bit is a quantum bit element in which a quantum bit is represented by photosensitivity to a point defect in a crystal lattice, and for example, a diamond NV center quantum bit element and a SiC silicon-vacancy center quantum bit element can be cited.

Among them, the semiconductor quantum bit element is preferred as the solid-state element quantum bit because of having a high affinity with the conventional semiconductor manufacturing process to contribute to ease of integration of the quantum bit cell from the viewpoint of ease of manufacture.

Further, among the semiconductor quantum bit elements, the MOSFET type quantum bit element and the TFET type quantum bit element, that is, those having a transistor structure in which a gate electrode is arranged through an insulating oxide film on a semiconductor-containing layer with a channel region formed of a semiconductor material between a source section and a drain section are preferable, and further one with silicon as the semiconductor material is particularly preferable. The case of the semiconductor quantum bit element having such a structure can utilize many manufacturing facilities used in the conventional semiconductor manufacturing process to contribute to ease of integration of the quantum bit cell from the viewpoint of ease of manufacture.

First Embodiment

Next, embodiments of the quantum bit cell according to the present invention will be described with reference to the accompanying drawings.

First, a quantum bit cell according to a first embodiment will be described with reference to FIG. 8. Note that FIG. 8 is a sectional view for describing an overview of the quantum bit cell according to the first embodiment.

Figure 8:
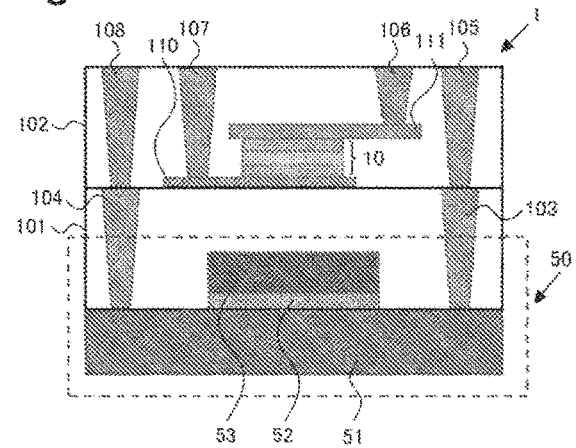
FIG. 8 is a sectional view for describing an overview of a quantum bit cell according to a first embodiment.

As illustrated in FIG. 8, a quantum bit cell 1 according to the first embodiment has the spin valve-type element 10 (see FIG. 1) as the spin torque oscillator, and a semiconductor quantum bit element 50 as the solid-state element quantum bit.

The semiconductor quantum bit element 50 has a transistor structure in which a gate electrode 53 is placed above a channel region of a semiconductor-containing layer 51 through an insulating oxide film 52, where the channel region is made of a semiconductor material and formed between the source section and the drain section.

The semiconductor-containing layer 51 can be constructed as a layered structure composed of a semiconductor layer in which the channel region is formed between a source region (the source section) and a drain region (the drain section), and the channel region formed of the semiconductor material between a source electrode (the source section) and a drain electrode (the drain section).

The surface side of the semiconductor-containing layer 51 on which the gate electrode 53 is formed is covered with a first contact layer 101 formed of an insulation material (for example, $SiO_2$) including the gate electrode 53.

The source section of the semiconductor-containing layer 51 is connected to a metal electrode 104 formed to penetrate through the first contact layer 101 in the thickness direction, and the drain section of the semiconductor-containing layer 51 is connected to a metal electrode 103 formed to penetrate through the first contact layer 101 in the thickness direction.

On the surface opposite to the side of the first contact layer 101 to contact with the semiconductor quantum bit element 50, the spin valve-type element 10 is placed through a lower electrode 110, and an upper electrode 111 is placed on the spin valve-type element 10.

The lower electrode 110, the spin valve-type element 10, and the upper electrode 111 are formed of the insulation material mentioned above, and covered with a second contact layer 102 laminated on the first contact layer 101.

The lower electrode 110 is connected to a metal electrode 107 provided in a manner to be buried in the second contact layer 102 in the thickness direction, and the upper electrode 111 is connected to a metal electrode 106 provided in a manner to be buried in the second contact layer 102 in the thickness direction. This makes an electric connection to the spin valve-type element 10 buildable.

Further, a metal electrode 105 formed to penetrate through the second contact layer 102 in the thickness direction is placed to connect to the metal electrode 103, and a metal electrode 108 formed to penetrate through the second contact layer 102 in the thickness direction is placed to connect to the metal electrode 104. This makes an electric connection to the semiconductor quantum bit element 50 buildable.

Here, the semiconductor quantum bit element 50 is placed near the spin valve-type element 10 at the interval of the propagation distance or less of the microwave emitted from the spin valve-type element 10 in such a manner that the quantum state can be controlled by the microwave.

Further, the size of the spin valve-type element 10 can be set to have a maximum diameter of 1 μm or less.

Therefore, the quantum bit cell 1 according to the first embodiment can be built in a narrow area, and hence has an easy-to-integrate structure.

Next, a manufacturing process of the quantum bit cell 1 according to the first embodiment will be described with reference to FIG. 9(a) to FIG. 9(j). Note that FIG. 9(a) to FIG. 9(j) are sectional views (1) to (10) for describing an overview of the manufacturing process of the quantum bit cell 1 according to the first embodiment.

Figure 9A:
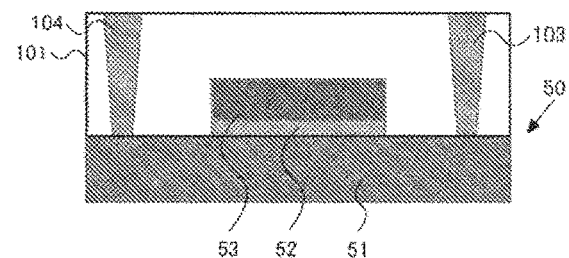
FIG. 9(a) is a sectional view (1) for describing an overview of a manufacturing process of a quantum bit cell 1 according to the first embodiment.

First, as illustrated in FIG. 9(a), a base structure in which the semiconductor quantum bit element 50 (the semiconductor-containing layer 51, the insulating oxide film 52, and the gate electrode 53), the first contact layer 101, and the metal electrodes 103, 104 are formed is manufactured. This base structure can be manufactured according to the manufacturing method of a conventional MOSFET (Field Effect Transistor) type quantum bit or TFET (Tunnel Field-Effect Transistor) type quantum bit.

Figure 9B:
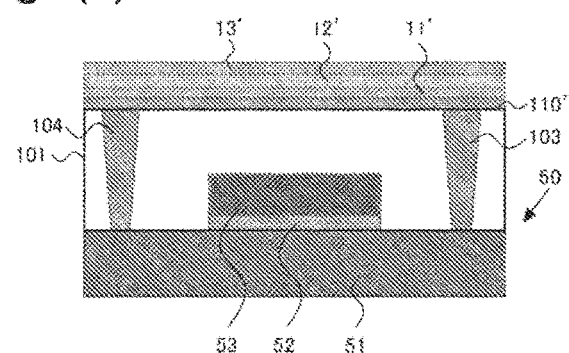
FIG. 9(b) is a sectional view (2) for describing the overview of the manufacturing process of the quantum bit cell 1 according to the first embodiment.

Next, as illustrated in FIG. 9(b), a lower electrode forming material layer 110', a reference layer forming material layer 11', a nonmagnetic layer forming material layer 12', and an oscillation layer forming material layer 13' are laminated in this order on the first contact layer 101.

Note that these layers are formed by the vapor deposition method or the sputtering method by using metal or insulators as the forming materials. Here, the description will continue assuming a case where the forming materials are all metal materials.

Figure 9C:
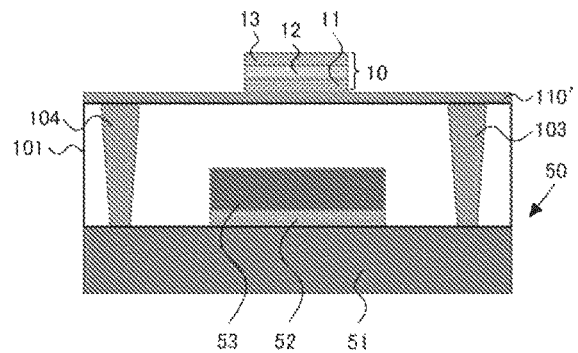
FIG. 9(c) is a sectional view (3) for describing the overview of the manufacturing process of the quantum bit cell 1 according to the first embodiment.

Next, as illustrated in FIG. 9(c), the spin valve-type element 10 is formed by a lithography process using a first mask (not illustrated) and a dry etching process.

Figure 9D:
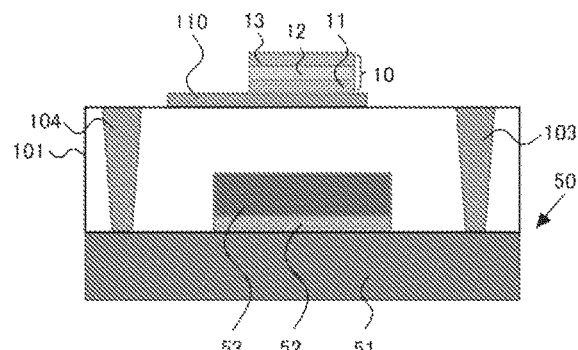
FIG. 9(d) is a sectional view (4) for describing the overview of the manufacturing process of the quantum bit cell 1 according to the first embodiment.

Further, as illustrated in FIG. 9(d), the lower electrode 110 is formed by the lithography process using a second mask (not illustrated) and the dry etching process.

Figure 9E:
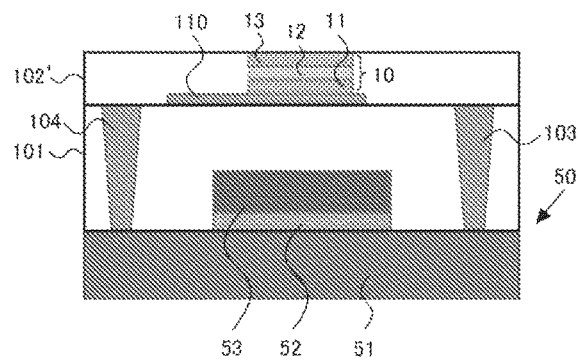
FIG. 9(e) is a sectional view (5) for describing the overview of the manufacturing process of the quantum bit cell 1 according to the first embodiment.

Next, as illustrated in FIG. 9(e), after the insulation materials are deposited on the first contact layer 101, the second contact layer forming material layer 102' is formed in such a manner that the oscillation layer 13 as the topmost layer of the spin valve-type element 10 is exposed by a chemical mechanical polishing (CMP) process.

Figure 9F:
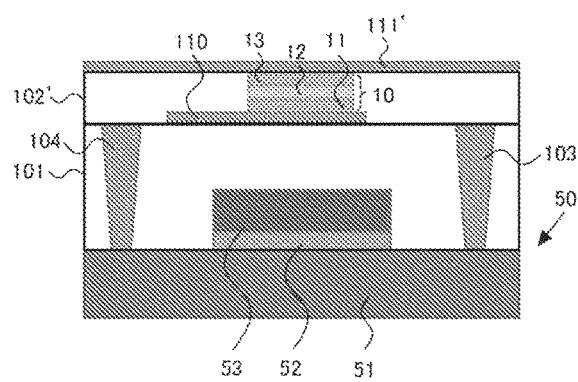
FIG. 9(f) is a sectional view (6) for describing the overview of the manufacturing process of the quantum bit cell 1 according to the first embodiment.

Next, as illustrated in FIG. 9(f), an upper electrode forming material layer 111' is formed on the second contact layer forming material layer 102' by the sputtering method.

Figure 9G:
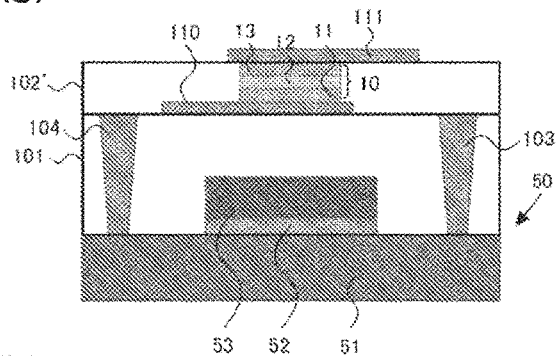
FIG. 9(g) is a sectional view (7) for describing the overview of the manufacturing process of the quantum bit cell 1 according to the first embodiment.

Further, as illustrated in FIG. 9(g), the upper electrode 111 is formed by the lithography process using a third mask (not illustrated) and the dry etching process.

Figure 9H:
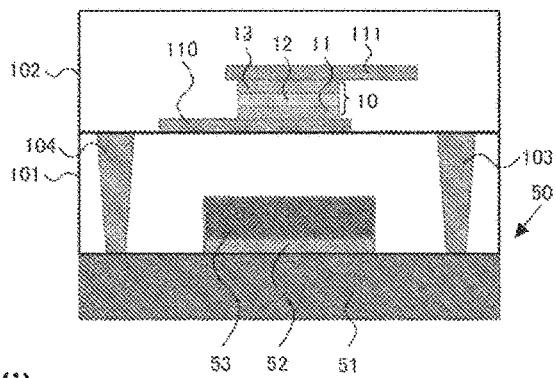
FIG. 9(h) is a sectional view (8) for describing the overview of the manufacturing process of the quantum bit cell 1 according to the first embodiment.

Next, as illustrated in FIG. 9(h), the second contact layer 102 is formed by depositing the same insulation material on the second contact layer forming material layer 102' by a chemical vapor deposition (CVD) method.

Figure 9I:
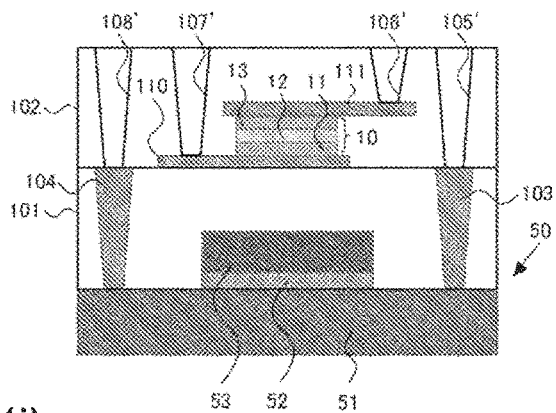
FIG. 9(i) is a sectional view (9) for describing the overview of the manufacturing process of the quantum bit cell 1 according to the first embodiment.

Next, as illustrated in FIG. 9(i), contact holes 105' to 108' are formed in the second contact layer 102 by the lithography process using a fourth mask (not illustrated) and the dry etching process.

Figure 9J:
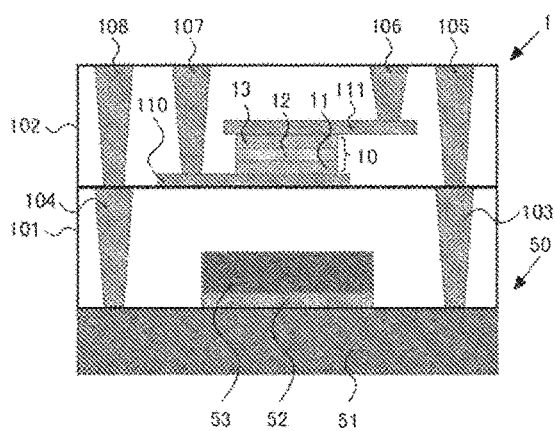
FIG. 9(j) is a sectional view (10) for describing the overview of the manufacturing process of the quantum bit cell 1 according to the first embodiment.

Further, as illustrated in FIG. 9(j), the metal electrodes 105 to 108 are formed in a manner to be embedded in the contact holes 105' to 108' by a metal plating method.

Further, the electric connection to the gate electrode 53 is built in such a manner that metal electrodes according to the metal electrodes 103, 104 are formed at the time of forming the first contact layer 101 in positions that avoid the spin valve-type element 10 in the back direction or the front direction on paper in FIG. 9(j), and metal electrodes according to the metal electrodes 105 to 108 are formed at the time of forming the second contact layer 102.

Thus, the quantum bit cell 1 (see FIG. 8) according to the first embodiment is formed.

In the quantum bit cell 1 according to the first embodiment, the structure having the spin valve-type element 10 is described, but the magnetic vortex element 15 (see FIG. 5) can also be used in the structure instead of the spin valve-type element 10 and can be formed according to the manufacturing process described with reference to FIG. 9(a) to FIG. 9(j).

Second Embodiment

Next, a quantum bit cell according to a second embodiment will be described with reference to FIG. 10. Note that FIG. 10 is a sectional view for describing an overview of the quantum bit cell according to the second embodiment.

Figure 10:
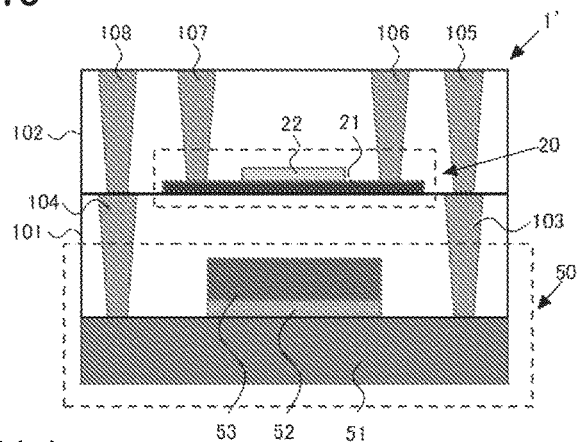
FIG. 10 is a sectional view for describing an overview of a quantum bit cell according to a second embodiment.

As illustrated in FIG. 10, a quantum bit cell 1' according to the second embodiment has the spin orbit torque-excited element 20 (see FIG. 6) as the spin torque oscillator and the semiconductor quantum bit element 50 as the solid-state element quantum bit, which is different from the quantum bit cell 1 according to the first embodiment in that the spin orbit torque-excited element 20 is arranged as the spin torque oscillator instead of the spin valve-type element 10. Since the other components are the same as those in the quantum bit cell 1 according to the first embodiment, the same reference numerals are illustrated to omit redundant description.

Here, the size of the spin orbit torque-excited element 20 can be set to have a maximum diameter of 1 μm or less.

Therefore, like the quantum bit cell 1 according to the first embodiment, the quantum bit cell 1' according to the second embodiment can be built in a narrow area, and hence has an easy-to-integrate structure.

Next, a manufacturing process of the quantum bit cell 1' according to the second embodiment will be described with reference to FIG. 11(a) to FIG. 11(i). Note that FIG. 11(a) to FIG. 11(i) are sectional views (1) to (9) for describing an overview of the manufacturing process of the quantum bit cell 1' according to the second embodiment.

Figure 11A:
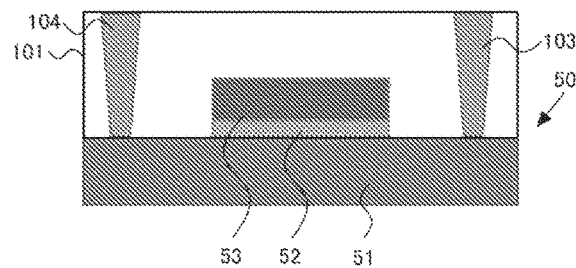
FIG. 11(a) is a sectional view (1) for describing an overview of a manufacturing process of a quantum bit cell 1' according to the second embodiment.

First, as illustrated in FIG. 11(a), a base structure in which the semiconductor quantum bit element 50 (the semiconductor-containing layer 51, the insulating oxide film 52, and the gate electrode 53), the first contact layer 101, and the metal electrodes 103, 104 are formed is manufactured.

Figure 11B:
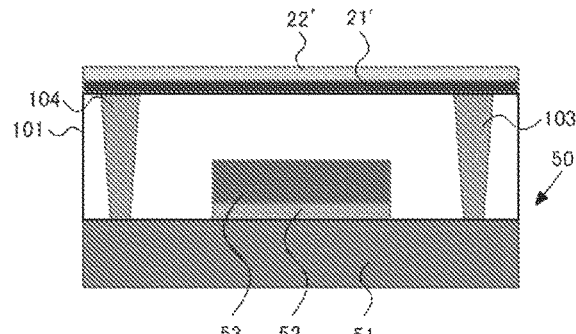
FIG. 11(b) is a sectional view (2) for describing the overview of the manufacturing process of the quantum bit cell 1' according to the second embodiment.

Next, as illustrated in FIG. 11(b), a nonmagnetic metal layer forming material layer 21' and an oscillation layer forming material layer 22' are laminated in this order on the first contact layer 101 by the vapor deposition method or the sputtering method.

Figure 11C:
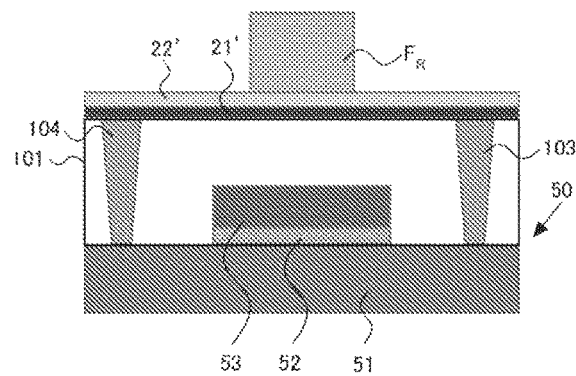
FIG. 11(c) is a sectional view (3) for describing the overview of the manufacturing process of the quantum bit cell 1' according to the second embodiment.

Next, as illustrated in FIG. 11(c), an oscillation layer processing resist $F_R$ is formed on the oscillation layer forming material layer 22' by the lithography process using a first' mask.

Figure 11D:
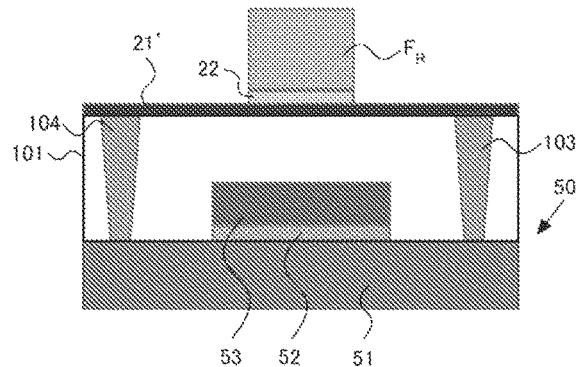
FIG. 11(d) is a sectional view (4) for describing the overview of the manufacturing process of the quantum bit cell 1' according to the second embodiment.

Next, as illustrated in FIG. 11(d), the oscillation layer 22 is formed by the dry etching process.

Figure 11E:
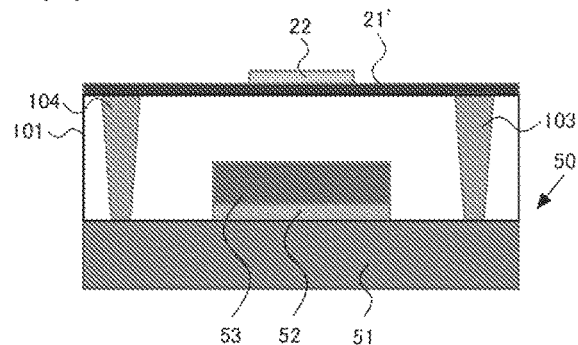
FIG. 11(e) is a sectional view (5) for describing the overview of the manufacturing process of the quantum bit cell 1' according to the second embodiment.
Figure 11F:
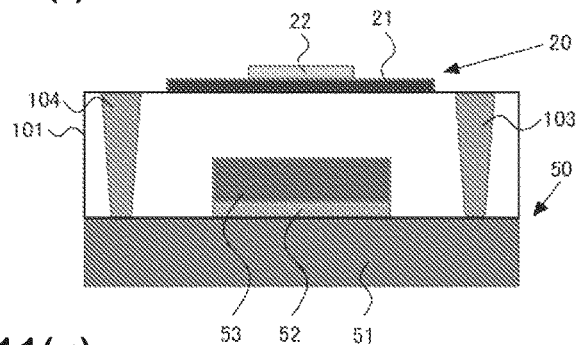
FIG. 11(f) is a sectional view (6) for describing the overview of the manufacturing process of the quantum bit cell 1' according to the second embodiment.

Next, as illustrated in FIG. 11(e), the oscillation layer processing resist $F_R$ is removed by an oxygen ashing process and chemical treatment using a resist remover (for example, EKC683 made by DuPont or an SPM cleaning solution (sulfuric acid:hydrogen peroxide=4:1). Note that the lithography process and the dry etching process illustrated in FIG. 11(c) to FIG. 11(e) illustrate a representative example of these processing methods, and similar processing methods can be applied even to any other manufacturing process of the quantum bit cells 1, 1'. Next, as illustrated in FIG. 11(f), the nonmagnetic metal layer 21 is formed by the lithography process using a second' mask and the dry etching process.

Figure 11G:
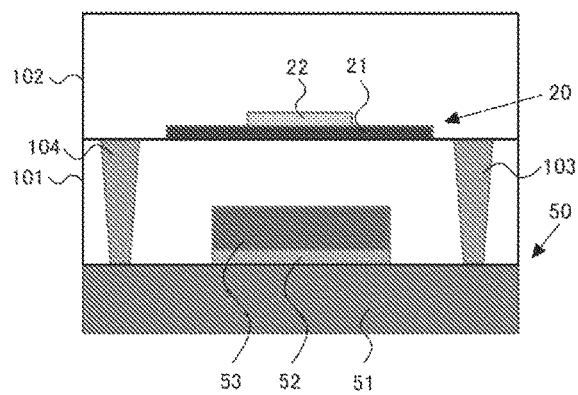
FIG. 11(g) is a sectional view (7) for describing the overview of the manufacturing process of the quantum bit cell 1' according to the second embodiment.

Next, as illustrated in FIG. 11(g), the insulation material is deposited by the chemical vapor deposition (CVD) method to form the second contact layer 102 on the first contact layer 101.

Figure 11H:
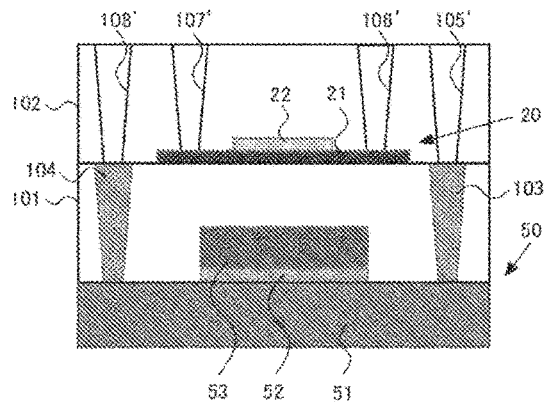
FIG. 11(h) is a sectional view (8) for describing the overview of the manufacturing process of the quantum bit cell 1' according to the second embodiment.

Next, as illustrated in FIG. 11(h), the contact holes 105' to 108' are formed through the second contact layer 102 by the lithography process using a third' mask and the dry etching process.

Figure 11I:
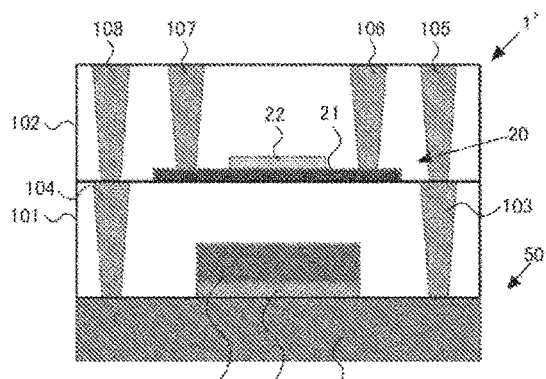
FIG. 11(i) is a sectional view (9) for describing the overview of the manufacturing process of the quantum bit cell 1' according to the second embodiment.

Further, as illustrated in FIG. 11(i), the metal electrodes 105 to 108 are formed in a manner to be embedded in the contact holes 105' to 108' by the metal plating method.

Thus, the quantum bit cell 1' according to the second embodiment (see FIG. 10) is formed.

Both of the manufacturing processes of the quantum bit cell 1 according to the first embodiment and the quantum bit cell 1' according to the second embodiment have affinities with the conventional semiconductor manufacturing process to contribute to ease of integration from the viewpoint of ease of manufacture.

Above all, it is easier to manufacture the quantum bit cell 1' according to the second embodiment than the quantum bit cell 1 according to the first embodiment, presenting more practical integration technology.

Namely, in the manufacturing process (FIG. 11(a) to FIG. 11(i)) of the quantum bit cell 1' according to the second embodiment, the processing using masks is performed three times using the first' mask to the third' mask, while in the manufacturing process (FIG. 9(a) to FIG. 9(j)) of the quantum bit cell 1 according to the first embodiment, the processing using masks is performed four times using the first mask to the fourth mask. Therefore, in the manufacturing process of the quantum bit cell 1' according to the second embodiment, the number of processes can be reduced more than that of the quantum bit cell 1 according to the first embodiment, and the complication of the manufacturing process itself due to the multiple mask position adjustment and the like can be avoided.

Further, in the quantum bit cell 1' according to the second embodiment, the contact holes 106', 107' can be formed in the second contact layer 102 at the same depth, while in the quantum bit cell 1 according to the first embodiment, the contact holes 106', 107' are formed at different depths. When the depths are different greatly depending on the thickness of the spin valve-type element 10 and the thickness of the upper electrode 111, since the degree of difficulty of contact hole formation increases, the manufacturing process of the quantum bit cell 1' according to the second embodiment in which the contact holes 106', 107' are formed at the same depth can be made easier than that of the quantum bit cell 1 according to the first embodiment.

(Quantum Bit Integrated Circuit)

A quantum bit integrated circuit of the present invention is constructed by arranging multiple quantum bit cells of the present invention mentioned above.

In the quantum bit integrated circuit, it is preferred that the spin torque oscillator in one quantum bit cell should be placed apart from the solid-state element quantum bit in the other quantum bit cell between two adjacent quantum bit cells by a distance to exceed the propagation distance of the microwave emitted from the spin torque oscillator.

Namely, when the quantum bit integrated circuit is thus constructed, multiple quantum bit cells can be arranged densely in the quantum bit integrated circuit while suppressing a crosstalk between two adjacent quantum bit cells.

Note that various components of a known quantum bit integrated circuit can be adopted appropriately as components of the quantum bit integrated circuit other than those described above as long as the components do not interfere with the effects of the present invention.

EXAMPLES

In order to clarify the respective characteristics of the solid-state element quantum bit and the spin torque oscillator that constitute the quantum bit cell of the present invention, the solid-state element quantum bit and the spin torque oscillator were manufactured individually, and the characteristics were measured. The details will be described below.

<Manufacturing of Solid-State Element Quantum Bit Cell>

The semiconductor quantum bit element having the transistor structure was manufactured as below as the solid-state element quantum bit in a working example.

First, an SOI wafer in which an $SiO_2$ insulation layer (BOX layer) with a thickness of 145 nm and the semiconductor layer (the semiconductor-containing layer) made of Si and doped with about $1 \times 10^{1}s$ $cm^{-3}$ of p-type impurities having a thickness of 50 nm are formed in this order on a handling Si layer was prepared.

Next, a protective oxide film is formed with a thickness of 5 nm on the semiconductor layer of this SOI wafer.

Next, a first resist layer was formed with a thickness of 200 nm on the protective oxide film by an electron beam lithography.

Next, ion implantation using As was performed from above the protective oxide film using the first resist layer as a mask with an acceleration energy of 5 keV and a dose amount of $2 \times 10^{15}$ $cm^{-2}$ to form the source region (the source section) within the semiconductor layer.

Next, the first resist layer was removed by the oxygen ashing process, and SPM (Sulfuric Acid Peroxide Mixture) cleaning was performed on the surface. As the SPM cleaning, a cleaning process using a mixture of $H_2SO_4$ and $H_2O_2$ at a ratio of 4:1 as the cleaning solution was performed at a temperature of 120° C.

Next, a second resist layer was formed with a thickness of 200 nm on the protective oxide film that was subjected to the SPM cleaning.

Next, ion implantation using $BF_2$ was performed from above the protective oxide film using the second resist layer as a mask with an acceleration energy of 5 keV and a dose amount of $2 \times 10^{15}$ $cm^{-2}$ to form the drain region (the drain section) within the semiconductor layer.

The source region and the drain region were formed on condition that the gate length between these regions was 60 nm.

Next, the oxygen ashing process and the SPM cleaning were performed by the same methods as the methods performed after the formation of the source region to remove the second resist layer and clean the surface of the protective oxide film after the removal thereof.

Next, activation annealing treatment was performed for one second at a temperature of 1,000° C. under an atmospheric pressure of $N_2$ gas to activate respective impurity substances in the source region and the drain region.

Next, from the side of the protective oxide film, Al ion implantation was performed with an acceleration energy of 15 keV and a dose amount of $5\times10^{13}$ cm$^{-2}$, and N ion implantation was performed with an acceleration energy of 15 keV and a dose amount of $5\times10^{13}$ cm$^{-2}$ to form a quantum dot forming semiconductor region containing Al and N as quantum dot forming impurities on respective layer sides of the semiconductor layer capable of forming the source region, the drain region, and the channel region between these regions.

Next, activation annealing treatment was performed for 60 hours at a temperature of 450° C. under an atmospheric pressure of $N_2$ gas to activate Al and N in the quantum dot forming semiconductor region.

Next, the protective oxide film was removed using dilute hydrofluoric acid (DHF) with a concentration of 1%.

Next, cleaning was performed using an SC2 cleaning solution (a mixture of HCl and $H_2O_2$) for five minutes under a temperature condition of 80° C.

Next, $HfO_2$ was deposited by an ALD method under a temperature condition of 250° C. to form the insulating oxide film (gate insulating film) on the quantum dot forming semiconductor region with a thickness of 3.6 nm. Note that the thickness of this insulating oxide film is 1.5 nm as a film thickness converted to an $SiO_2$ film (EOT:Equivalent Oxide Thickness).

Next, an electrode layer having a laminated structure in which TaN (with a thickness of 10 nm) and poly-Si (with a thickness of 50 nm) were laminated is formed with a thickness of 60 nm on the insulating oxide film by the sputtering method.

Next, the insulating oxide film and the electrode layer were formed by the lithography process using a mask to form the source electrode and the drain electrode made of the forming material of the electrode layer on the respective regions of the source region and the drain region, and further to form the gate electrode made of the forming material of the electrode layer on the channel region through the insulating oxide film.

As above, the semiconductor quantum bit element having the transistor structure was manufactured as the solid-state element quantum bit in the working example.

<Measurement of Characteristics of Solid-State Element Quantum Bit>

The characteristics of the solid-state element quantum bit in the working example were measured as below.

First, the SOI wafer used for element formation of the solid-state element quantum bit in the working example was divided to cut out a small piece including the solid-state element quantum bit.

Next, the small piece was mounted on a device evaluation package (C-DIP made by Kyocera Corp.) with silver paste to connect the source electrode, the drain electrode, and the gate electrode to electrodes on the side of the device evaluation package, respectively, by wire bonding so as to form a measurement sample.

Next, this measurement sample was inserted into and mounted on a cooling unit inside a refrigerator (STD TESLATRON 14T SYSTEM GA made by Oxford Instruments). Further, a microwave irradiation wire was placed inside the cooling unit at a position a few mm away from the small piece.

Next, the electrodes on the side of the device evaluation package and the microwave irradiation wire were connected to an externally installed measuring instrument group by wiring inside the refrigerator.

Specifically, a voltage source (7651 programable DC source made by Yokokawa Test & Measurement Corp.) was connected to each of the electrodes on the side of the device evaluation package, which were connected to the drain electrode and the gate electrode. Further, an amplifier (current amplifier 1211 made by DL Instruments, LLC) for amplifying an electric current to be output as a voltage was also connected to an electrode on the side of the device evaluation package, which was connected to the drain electrode, and the electric current obtained was measured as a voltage value by a digital multimeter (34401A made by Keysight Technologies). A microwave generator (E8257D made by Keysight Technologies) was connected to the microwave irradiation wire. Note that an electrode on the side of the device evaluation package, which was connected to the source electrode, was grounded.

The refrigerator includes an external magnetic field application mechanism capable of applying an external magnetic field to the small piece.

Next, an external magnetic field of 0.276 T was applied after the temperature of the refrigerator is lowered up to 1.5 K, and the voltage source was used to apply voltages of 0.33 V and −0.36 V to the drain electrode and the gate electrode, respectively. Under this condition, the frequency of the microwave generator was set to 9.01 MHz and the output power was set to −14 dBm to irradiate a pulse-shaped microwave from the microwave irradiation wire to the small piece so as to apply an AC magnetic field to the solid-state element quantum bit.

Note that the output power here is a set value of the microwave generator. Since there is a power attenuation according to the distance between the microwave irradiation wire and the solid-state element quantum bit, the output power is different from the strength of the AC magnetic field applied to the solid-state element quantum bit in practice.

Figure 12:
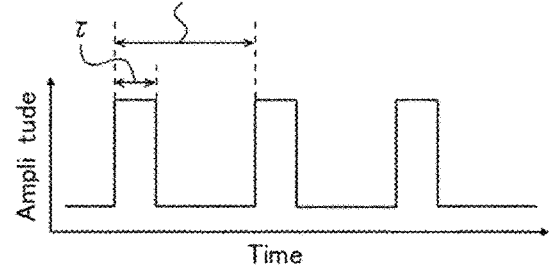
FIG. 12 is an illustration for describing an overview of a pulsed microwave used for measurement.

Further, the pulsed microwave was irradiated as a pulse train in which many pulses each having a pulse length π were continuously lined up in cycle T as illustrated in FIG. 12. Note that the cycle T was set to 2 µs and the pulse length π was set to 1 µs at maximum in the measurement. According to such an irradiation method, the pulse length π is equal to the irradiation time of the microwave to the solid-state element quantum bit.

Note that FIG. 12 is an illustration for describing an overview of the pulsed microwave used for the measurement.

Figure 13:
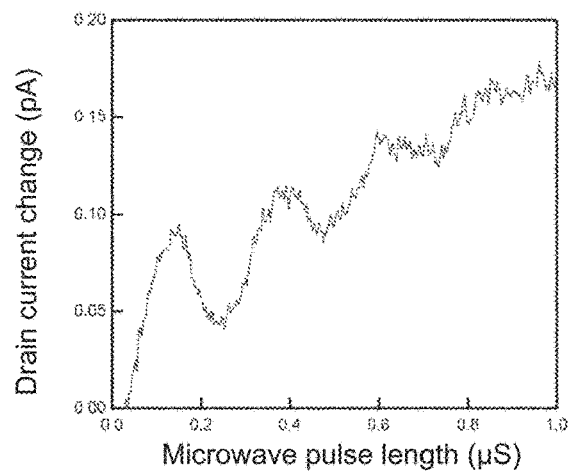
FIG. 13 is a chart illustrating measurement results when changes in drain current before and after the irradiation of a pulse train are represented on the vertical line and the pulse length is represented on the horizontal line.

The measurement results when changes in drain current before and after the irradiation of the pulse train are represented on the vertical line and the pulse length is represented on the horizontal line are illustrated in FIG. 13.

As illustrated in FIG. 13, current oscillations depending on the pulse length are observed. The oscillations are Rabi oscillations representing quantum bit operation, which indicate that the quantum states of |0> and |1> are changing with intervention of the intermediate state.

In the measurement results illustrated in FIG. 13, the electric current is rising to the right due to the presence of background current and the amplitude is attenuated with the relaxation of the quantum states.

Here, an ideal Rabi oscillation is expressed by equations (1) and (2) below.

[Numerical Equation 1]

$$P_0(t)=1-\sin^2\omega_R t \quad (1)$$

$$\omega_R=g\mu_B/4\hbar B_x \quad (2)$$

Note that $P_0$ in the equations (1) and (2) denotes the magnitude of a Rabi oscillation, $\omega_R$ denotes the angular frequency of the Rabi oscillation, g denotes an electron g-factor as the quantum bit, $\mu_B$ denotes the Bohr magneton (physical constant), $\hbar$ (h-bar) denotes the Planck constant, and $B_x$ denotes the magnitude of the AC magnetic field applied to the solid-state element quantum bit. Note further that the g-factor is calculated as 2.3 from another experiment.

Using the equations (1) and (2), when the angular frequency $\omega_R$ is calculated from the cycle of the Rabi oscillation $P_0$ observed from FIG. 13 (0.25 μs) to determine the strength $B_x$ of the AC magnetic field, the strength $B_x$ of the AC magnetic field is about 0.5 mT.

Thus, it is found that the quantum bit operation of the solid-state element quantum bit illustrated in FIG. 13 is realized by the AC magnetic field strength of about 0.5 mT.

In general, since it is required that the quantum bit operation is realized by an AC magnetic field strength of about 0.1 mT to several mT, it can be said that the quantum bit operation of the solid-state element quantum bit in the working example has suitable operating characteristics.

<Manufacturing of Spin Torque Oscillator>

The spin valve-type element (of the third type) as the spin torque oscillator in the working example was manufactured as below.

Figure 14:
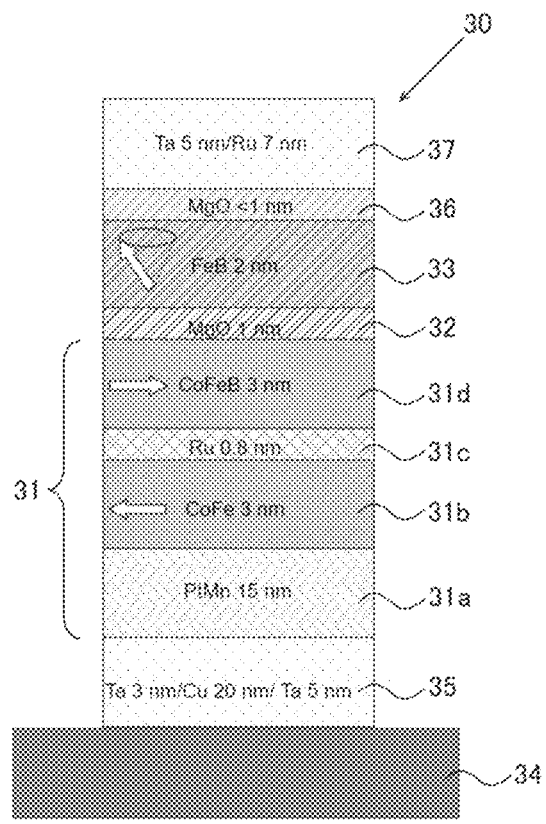
FIG. 14 is a schematic diagram illustrating a layer structure of a spin torque oscillator in a working example.

The spin torque oscillator in the working example was manufactured in a layer structure illustrated in FIG. 14. Note that FIG. 14 is a schematic diagram illustrating the layer structure of the spin torque oscillator in the working example.

Specifically, the spin torque oscillator was so manufactured that a buffer layer 35, a reference layer 31, a nonmagnetic layer 32, an oscillation layer 33, a cap layer 36, and a protective layer 37 were formed in this order on a silicon substrate (made by Shin-Etsu Chemical Co. Ltd., with a thermal oxide film of 500 nm and N type, and having crystal orientation (100)). Each layer was formed by using sputtering equipment (C-7100 made by Canon Anelva Corp.) to perform high-frequency magnetron sputtering on the forming material of the layer under an ultrahigh vacuum condition ($10^{-6}$ Pa to $10^{-7}$ Pa).

The buffer layer 35 was formed by laminating a Ta layer with a thickness of 5 nm, a Cu layer with a thickness of 20 nm, and a Ta layer with a thickness of 3 nm in this order from the side of the silicon substrate.

The reference layer 31 was formed by laminating a PtMn layer (antiferromagnet layer) 31a with a thickness of 15 nm, a CoFe layer (ferromagnetic layer) 31b with a thickness of 3 nm, an Ru layer 31c with a thickness of 0.8 nm, and a CoFeB layer (ferromagnetic layer) 31d with a thickness of 3 nm in this order from the side of the buffer layer 35. The directions of magnetizations in the CoFe layer (ferromagnetic layer) 31b and the CoFeB layer (ferromagnetic layer) 31d are both intra-layer directions, and one of them is an intra-layer direction opposite to the other.

The nonmagnetic layer 32 was formed of an MgO layer with a thickness of 1 nm as the magnetic tunnel junction (MTJ) film.

The oscillation layer 33 was formed of an FeB layer (ferromagnetic oscillation layer) with a thickness of 2 nm as such a layer that perpendicular magnetic anisotropy was induced at the interface between the nonmagnetic layer 32 and the cap layer 36, and at the time of excitation, the magnetization precessed around the vertical axis orthogonal to the intra-layer direction.

The cap layer 36 was formed as an MgO layer with a thickness of less than 1 nm.

The protective layer 37 was formed by laminating an Ru layer with a thickness of 7 nm and a Ta layer with a thickness of 5 nm in this order from the side of the cap layer 36.

Thus, a ferromagnetic tunnel junction (MTJ) type spin torque oscillator 30 formed on the silicon substrate is constituted as the spin torque oscillator in the working example.

By the structure and formation method of this ferromagnetic tunnel junction (MTJ) type spin torque oscillator 30, an element was made in processes illustrated in FIG. 15(a) to FIG. 15(i). Note that FIG. 15(a) to FIG. 15(i) are schematic diagrams (1) to (9) illustrating processes of manufacturing the element. In the diagrams, the ferromagnetic tunnel junction (MTJ) type spin torque oscillator 30 and a forming material layer 30' thereof are illustrated by symbolizing only three layers, that is, only the reference layer, the nonmagnetic layer, and the oscillation layer laminated in this order from the side closest to the silicon substrate for simplification of the drawings. Description will be specifically made below.

Figure 15A:
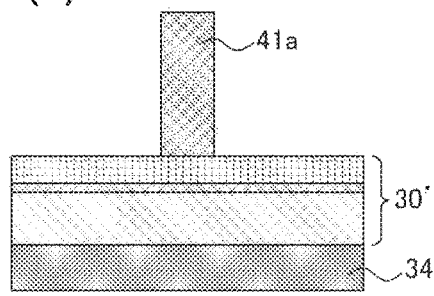
FIG. 15(a) is a schematic diagram (1) illustrating an element manufacturing process.

First, as illustrated in FIG. 15(a), a resist layer 41a was formed on the forming material layer 30' of the ferromagnetic tunnel junction type spin torque oscillator 30.

Figure 15B:
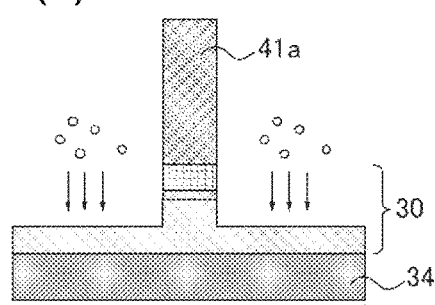
FIG. 15(b) is a schematic diagram (2) illustrating the element manufacturing process.

Next, as illustrated in FIG. 15(b), etching was carried out using the resist layer 41a as a mask to process the shape of the forming material layer 30' so as to form the ferromagnetic tunnel junction type spin torque oscillator 30.

Figure 15C:
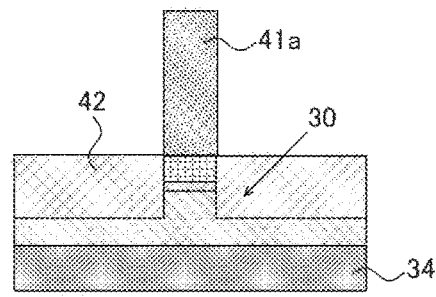
FIG. 15(c) is a schematic diagram (3) illustrating the element manufacturing process.

Next, as illustrated in FIG. 15(c), an $SiO_2$ layer (insulation layer) 42 was deposited by sputtering to cover the perimeter of the ferromagnetic tunnel junction type spin torque oscillator 30 with the $SiO_2$ layer 42.

Figure 15D:
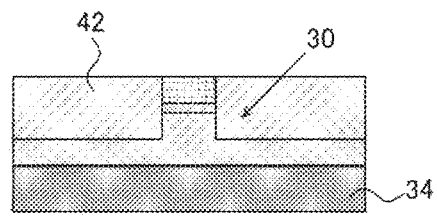
FIG. 15(d) is a schematic diagram (4) illustrating the element manufacturing process.

Next, as illustrated in FIG. 15(d), the resist layer 41a was removed by lift-off.

Figure 15E:
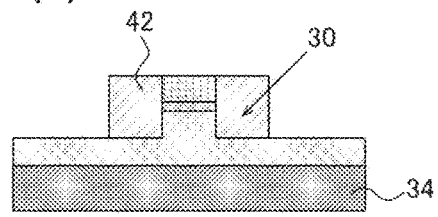
FIG. 15(e) is a schematic diagram (5) illustrating the element manufacturing process.

Next, as illustrated in FIG. 15(e), part of the $SiO_2$ layer 42 was removed by etching using a resist mask (not illustrated) to make part of the reference layer exposed.

Figure 15F:
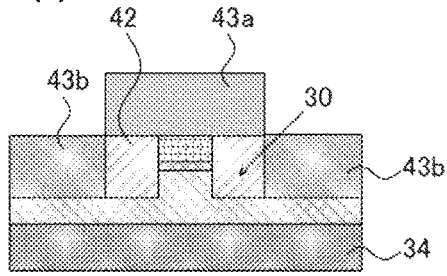
FIG. 15(f) is a schematic diagram (6) illustrating the element manufacturing process.

Next, as illustrated in FIG. 15(f), an Au layer with a thickness of 200 nm was deposited uniformly by sputtering using a high-frequency magnetron sputtering equipment to form an upper electrode 43a on the oscillation layer and a lower electrode 43b on the reference layer.

Figure 15G:
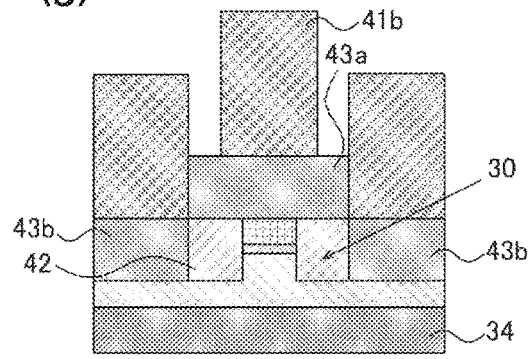
FIG. 15(g) is a schematic diagram (7) illustrating the element manufacturing process.

Next, as illustrated in FIG. 15(g), a resist layer 41b was formed on the upper electrode 43a and the lower electrode 43b.

Figure 15H:
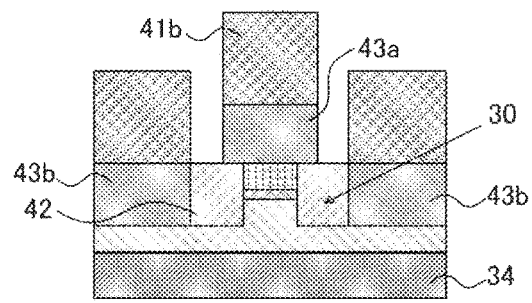
FIG. 15(h) is a schematic diagram (8) illustrating the element manufacturing process.

Next, as illustrated in FIG. 15(h), etching using the resist layer 41b as a mask was carried out to remove part of the upper electrode 43a so as to separate the upper electrode 43a and the lower electrode 43b from each other.

Figure 15I:
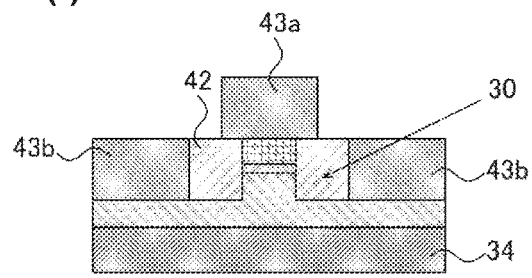
FIG. 15(i) is a schematic diagram (9) illustrating the element manufacturing process.

Next, as illustrated in FIG. 15(i), the resist layer 41b was removed by lift-off.

Thus, the spin torque oscillator in the working example was made as an element.

Note that a diameter d of the oscillation layer made smaller than that of the reference layer in the manufactured spin torque oscillator is 350 nm.

<Measurement of Characteristics of Spin Torque Oscillator>

The R—H curve measurement and oscillation spectrum measurement were made on the spin torque oscillator in the working example by measuring methods described in Reference 5 below.

Reference 5: S. Tamaru et al., "Bias field angle dependence of the self-oscillation of spin torque oscillators having a perpendicularly magnetized free layer and in-plane magnetized reference layer," Applied Physics Express 7.6 (2014): 063005.

The R—H curve measurement was made by applying a bias magnetic field $H_B$ in the same direction as the lamination direction of the oscillation layer that constitutes part of the spin torque oscillator. The results of the R—H curve measurement is illustrated in FIG. 16.

Figure 16:
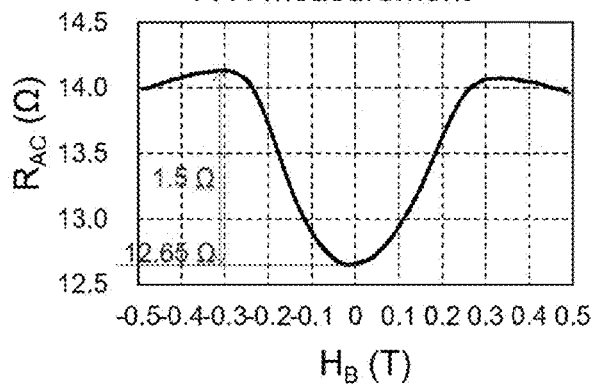
FIG. 16 is a chart illustrating R—H curve measurement results.

As illustrated in FIG. 16, the magnetic resistance RAC was largest when the magnetic field strength of the bias magnetic field $H_B$ is −0.3 mT, and a difference from the smallest magnetic resistance RAC (12.65 Ω) was 1.5 Ω.

From this result, the MR ratio of the spin torque oscillator is estimated as 24%.

The oscillation spectrum measurement was made by setting the magnetic field strength of the bias magnetic field $H_B$ to 490.56 mT, a bias voltage $V_B$ to −225 mV, and the application direction of the bias magnetic field HB to a direction in which the angle with the surface of the oscillation layer that constitutes part of the spin torque oscillator is 78°. The results of the oscillation spectrum measurement are illustrated in FIG. 17.

Figure 17:
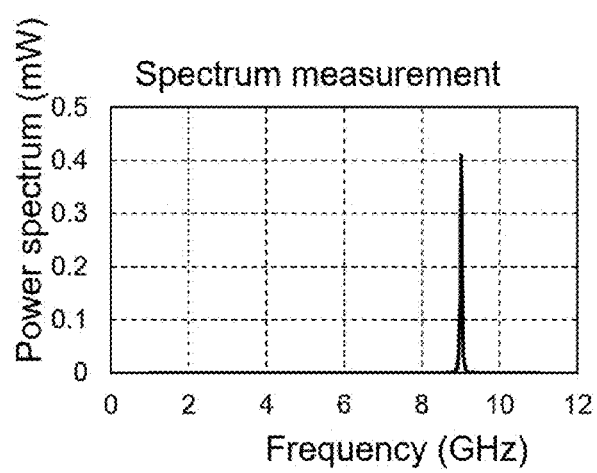
FIG. 17 is a chart illustrating oscillation spectrum measurement results.

As illustrated in FIG. 17, the oscillation spectrum of the spin torque oscillator had a peak near 9.01 MHz, and the oscillation frequency of the spin torque oscillator was 9.0077 GHz.

Since this oscillation frequency is equivalent to the frequency (9.01 GHz) of the microwave generator used for the operation verification of the solid-state element quantum bit in the working example, it can be applied to the operation of the solid-state element quantum bit.

The operation of the solid-state element quantum bit in the working example was confirmed under a magnetic field strength of about 0.5 mT.

Therefore, in addition to the oscillation frequency characteristics, a relationship between the strength of the magnetic field that the spin torque oscillator can apply to the solid-state element quantum bit and the distance therebetween was calculated.

Figure 18:
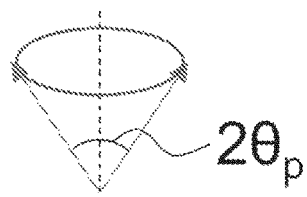
FIG. 18 is a schematic diagram illustrating a trajectory of precession in an oscillation layer at the time of excitation.

First, an angle θp of precession in the oscillation layer that constitutes part of the spin torque oscillator at the time of excitation was calculated to be 46° when the vertex angle of a cone obtained by drawing a trajectory of the precession illustrated in FIG. 18 is set as 2θp. Note that this precession angle θp was calculated using the MR ratio (24%) based on equations (2) to (4) in Reference 6 below. Note further that FIG. 18 is a schematic diagram illustrating the trajectory of precession in the oscillation layer at the time of excitation.

Reference 6: B. Wang et al. "Diameter dependence of emission power in MgO-based nano-pillar spin-torque oscillators," Applied Physics Letters 108.25 (2016): 253502.

Figure 19:
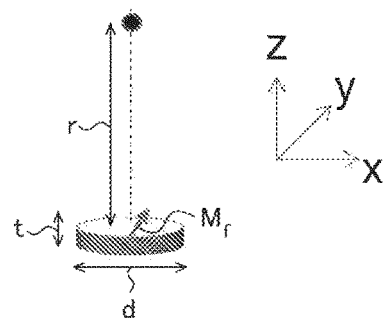
FIG. 19 is a schematic diagram illustrating an overview of a calculation target.

Next, based on the obtained $θ_p$, the strength of a microwave magnetic field, which was generated around by a magnetization $M_f$ of the oscillation layer illustrated in FIG. 19 and applied to a position at a distance r away from a position directly above the oscillation layer was calculated. Note that this calculation was done based on a known calculation formula related to the magnetic field strength by setting a thickness t of the oscillation layer to 2 nm, a diameter d of the oscillation layer to 350 nm, and a saturation magnetic flux density $B_s$ of the oscillation layer to 1.8 T as a value estimated form the VSM measurement. Note that FIG. 19 is a schematic diagram illustrating an overview of the calculation target.

As a result, such a calculation result that a DC magnetic field with a magnetic field strength of 0.5 mT (rms) acts at a position with a distance r of 305 nm was obtained.

Namely, the spin torque oscillator in the working example can operate the solid-state element quantum bit by placing the spin torque oscillator at an interval of about 305 nm from the solid-state element quantum bit.

Each of the R—H curve measurement and the oscillation spectrum measurement was made in a room temperature environment. Therefore, the characteristics of the spin torque oscillator at the operating temperature (low-temperature environment) of the solid-state element quantum bit are further examined.

Ferromagnetic FeB as the forming material of the oscillation layer in the spin torque oscillator has magnetic characteristics very close to and the same BCC crystal structure as CoFeB more general as the forming material of the oscillation layer. The Curie temperature of CoFeB is very high, which ranges from 750 K to 900 K, and the saturation magnetization thereof gradually rises as the temperature drops (see Reference 7 below). Therefore, it is considered that the saturation magnetization of FeB exhibits a temperature dependence similar to that of CoFeB. The MR ratio in the ferromagnetic tunnel junction (MTJ) type spin torque oscillator also rises as the temperature drops (see References 8 and 9 below). Since the spin polarization rate is proportional to the MR ratio, it is also considered that the spin polarization rate exhibits a temperature dependence similar to that of the MR ratio.

Assuming that the magnitude of an electric current injected into the spin torque oscillator is constant, the spin torque oscillator oscillates with larger amplitude as the spin polarization rate rises in a low temperature environment. Further, since the saturation magnetization also rises, it is assumed that the spin torque oscillator generates a larger AC magnetic field due to the synergistic effect of them.

The oscillation frequency in the spin torque oscillator is determined by the total effective magnetic field felt by the oscillation layer. Since an anisotropic magnetic field increases generally at a low temperature (see Reference 7 below), it is assumed that the oscillation frequency of the spin torque oscillator rises in the low temperature environment. However, since the anisotropic magnetic field is just one of magnetic fields in the total effective magnetic field, it can be compensated by adjusting any other magnetic field (for example, an externally applied magnetic field).

In the oscillation characteristics of the spin torque oscillator, the spectral line width exhibits the most prominent temperature dependence, which decreases as the temperature drops. This is because the thermal agitation magnetic field felt by the oscillation layer decreases, and it can be said that this characteristic is rather very preferable from the viewpoint of using the spin torque oscillator to operate the solid-state element quantum bit in the low temperature environment.

From the above, the spin torque oscillator in the working example can be used to operate the solid-state element quantum bit even in the low temperature environment by adjusting the externally applied magnetic field as needed.

Reference 7: K.-M. Lee et al., AIP Advances 7, 065107 (2017).

Reference 8: S. Yuasa et al., J. Phys. Soc. Jpn. 77, 031001(2008).

Reference 9: S. G. Wang et al., Phys. Rev. B, 78, 180411 (2008).

Note that the spin torque oscillator in the working example is constituted as the ferromagnetic tunnel junction (MTJ) type spin torque oscillator, but it can be considered that similar (low-temperature) operation is possible even in any other type of spin torque oscillator.

Namely, there are differences in various oscillation characteristics of the spin torque oscillator, such as the frequency, the output, and the oscillation threshold current, depending on the type thereof. However, as will be understood through References 10 to 13 below, since various magnetic characteristics, such as the saturation magnetization, the anisotropic magnetic field, and the spin polarization rate, exhibit consistent behavior with the temperature dependence described above, any other type of spin torque oscillator can be considered in the same manner as the spin torque oscillator in the working example.

Reference 10: M. L. Schneider et al., Phys. Rev. B 80, 144412 (2009).

Reference 11: J. F. Sierra et al., Appl. Phys. Lett. 101, 062407 (2012).

Reference 12: P. Bortolotti et al., Appl. Phys. Lett. 100, 042408 (2012).

Reference 13: R. H. Liu et al., Phys. Rev. Lett. 110, 147601 (2013).

Note that the solid-state element quantum bit and the spin torque oscillator are manufactured separately in the working example to clarify individual characteristics, but they can be formed integrally as in the example illustrated in FIG. 11(a) to FIG. 11(i) to manufacture the quantum bit cell according to the present invention.

DESCRIPTION OF REFERENCE NUMERALS 1, 1' quantum bit cell
10, 10A, 10B, 10C spin valve-type element
11, 11A, 11B, 11C, 16, 31 reference layer
11' reference layer forming material layer
12, 12A, 12B, 12C, 17, 32 nonmagnetic layer
12' nonmagnetic layer forming material layer
13, 13A, 13B, 13C, 18, 22, 33 oscillation layer
13', 22' oscillation layer forming material layer
15 magnetic vortex element
20 spin orbit torque-excited element
21 nonmagnetic metal layer
21' nonmagnetic metal layer forming material layer
30 ferromagnetic tunnel junction (MTJ) type spin torque oscillator
30' forming material layer
31a PtMn layer
31b CoFe layer
31c Ru layer
31d CoFeB layer
34 silicon substrate
35 buffer layer
36 cap layer
37 protective layer
41a, 41b resist layer
42 $SiO_2$ layer
43a upper electrode
43b lower electrode
50 semiconductor quantum bit element
51 semiconductor-containing layer
52 insulating oxide film
53 gate electrode
101 first contact layer
102 second contact layer
102' second contact layer forming material layer
103, 104, 105, 106, 107, 108 metal electrode
105', 106', 107', 108' contact hole
110 lower electrode
110' lower electrode forming material layer
111 upper electrode
111' upper electrode forming material layer
$F_R$ oscillation layer forming resist

The invention claimed is:

1. A quantum bit integrated circuit comprising:
a plurality of quantum bit cells,
wherein two or more of the plurality of quantum bit cells individually include
a spin torque oscillator that emits a microwave with a propagation distance of 1 μm or less and having a maximum diameter of 1 μm or less; and
a solid-state element quantum bit arranged near the spin torque oscillator at an interval of the propagation distance or less, where a quantum two-level system is controlled by the microwave, and
wherein between two adjacent quantum bit cells, a spin torque oscillator in a first one of the plurality of quantum bit cells and a solid-state element quantum bit in a second one of the plurality of quantum bit cells are placed apart from each other by a distance to exceed the propagation distance of the microwave emitted from the spin torque oscillator.

2. The quantum bit integrated circuit according to claim 1, wherein the spin torque oscillator is constructed by a spin orbit torque-excited element having a two-layer laminated structure of a nonmagnetic metal layer and an oscillation layer.

3. The quantum bit integrated circuit according to claim 1, wherein the spin torque oscillator is constructed by a spin valve-type element having a three-layer laminated structure composed of a laminated body of a reference layer and a nonmagnetic layer, and an oscillation layer laminated on the laminated body in such a manner that magnetization in the oscillation layer when not being excited points in one direction.

4. The quantum bit integrated circuit according to claim 1, wherein the spin torque oscillator is constructed by a magnetic vortex element having a three-layer laminated structure composed of a laminated body of a reference layer and a nonmagnetic layer, and an oscillation layer laminated on the laminated body in such a manner that magnetization in the oscillation layer when not being excited exhibits a vortex distribution.

5. The quantum bit integrated circuit according to claim 1, wherein the solid-state element quantum bit is constructed by a semiconductor quantum bit element.

6. The quantum bit integrated circuit according to claim 5, wherein the semiconductor quantum bit element has a transistor structure in which a gate electrode is arranged through an insulating oxide film on a semiconductor-containing layer with a channel region formed of a semiconductor material between a source section and a drain section.

* * * * *